US009817429B2

(12) United States Patent
Ivanov

(10) Patent No.: US 9,817,429 B2
(45) Date of Patent: Nov. 14, 2017

(54) CIRCUITS AND METHODS FOR TRIMMING AN OUTPUT PARAMETER

(71) Applicant: Texas Instruments Incorporated, Dallas, TX (US)

(72) Inventor: Vadim Valerievich Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 14/749,888

(22) Filed: Jun. 25, 2015

(65) Prior Publication Data

US 2016/0004269 A1 Jan. 7, 2016

Related U.S. Application Data

(60) Provisional application No. 62/020,094, filed on Jul. 2, 2014.

(51) Int. Cl.

*H01L 35/00* (2006.01)
*G05F 3/26* (2006.01)
*G05F 3/30* (2006.01)
*G05F 3/20* (2006.01)

(52) U.S. Cl.

CPC . *G05F 3/30* (2013.01); *G05F 3/20* (2013.01)

(58) Field of Classification Search

CPC .......... G05F 3/267; G05F 3/242; G05F 1/625; G05F 1/575; G05F 3/30
USPC ................................ 327/539–544, 362, 321
See application file for complete search history.

(56) References Cited

U.S. PATENT DOCUMENTS 6,501,256 B1 * 12/2002 Jaussi ....................... G05F 3/30 323/315
6,614,305 B1 9/2003 Ivanov et al.
6,628,169 B2 9/2003 Ivanov et al.
6,724,176 B1 * 4/2004 Wong ........................ G05F 3/30 323/314
6,750,641 B1 6/2004 Ivanov et al.
7,728,575 B1 * 6/2010 Ozalevli .................. G05F 3/30 323/313
8,941,369 B2 * 1/2015 Youssefi .................. G05F 3/30 323/313
2010/0156384 A1 * 6/2010 Ozalevli .................. G05F 3/30 323/313

* cited by examiner

*Primary Examiner* — Dinh T Le
(74) *Attorney, Agent, or Firm* — Goutham Kondapalli; Charles A. Brill; Frank D. Cimino

(57) ABSTRACT

Methods and circuits for adjusting the output parameter of a device wherein the output parameter is temperature dependent are disclosed herein. An example of a method includes: adjusting the output parameter to a target level at a first temperature; adjusting a linear temperature-dependent variable related to the output parameter to zero at the first temperature; adjusting a nonlinear temperature-dependent variable related to the output parameter to zero at the first temperature; adjusting the output parameter to the target level at a second temperature using the linear-dependent variable; adjusting the nonlinear temperature-dependent variable to zero at the second temperature; and adjusting the output parameter to the target level at a third temperature by adjusting the nonlinear variable.

20 Claims, 5 Drawing Sheets

CIRCUITS AND METHODS FOR TRIMMING AN OUTPUT PARAMETER

This application claims priority to U.S. provisional patent application 62/020,094 filed on Jul. 2, 2014 for TRIMMING METHODOLOGY FOR SENSORS WITH NONLINEAR TEMPERATURE DEPENDENCE of Vadim V. Ivanov.

BACKGROUND

Many parameters of electronic devices, such as sensors that measure environment variables, are temperature dependent. For example, bandgap voltage references have up to 50 ppm/° C. temperature dependence, operational amplifier input offset voltages drift may be up to 20 μV/° C., and quartz frequency references may have 10-20 ppm/° C. frequency drift. In most cases, the temperature dependence or drifting due to temperature is not linear.

To improve initial accuracy of electronic devices, a single-temperature trim or adjustment of at least one parameter is performed at room temperature, such as 27° C.

A technique employed to eliminate the first-order (linear part) of the temperature drift is described in U.S. Pat. No. 6,614,305. By this method, the output parameter is trimmed at a first temperature, for example, 100° C., to a target level using a variety of techniques such as laser resistor trimming or link cut. In addition, a temperature-dependent variable, such as the difference between current that is proportional to absolute temperature (PTAT) and current that is complementary to absolute temperature (CTAT) is trimmed to zero.

At a second temperature, for example, 20° C., the temperature-dependent variable is used to trim a parameter of interest to a target specification. This trimming does not change the output at the first temperature because this variable was previously trimmed to zero. As a result, the linear temperature dependence of the parameter of interest is eliminated or reduced.

These temperature compensation methods do not compensate for nonlinear fluctuations due to temperature. These nonlinear fluctuations become significant as more precise output parameters are required.

SUMMARY

Methods and circuits for adjusting the output parameter of a device wherein the output parameter is temperature dependent are disclosed herein. An example of a method includes: adjusting the output parameter to a target level at a first temperature; adjusting a linear temperature-dependent variable related to the output parameter to zero at the first temperature; adjusting a nonlinear temperature-dependent variable related to the output parameter to zero at the first temperature; adjusting the output parameter to the target level at a second temperature using the linear-dependent variable; adjusting the nonlinear temperature-dependent variable to zero at the second temperature; and adjusting the output parameter to the target level at a third temperature by adjusting the nonlinear variable. The third temperature may be between the first temperature and the second temperature.

In some examples, the output parameter is output voltage. An example of the linear temperature-dependent variable includes a current. Another example includes the difference between a current that is proportional to absolute temperature and a current that is complementary to absolute temperature. In some examples, the nonlinear temperature-dependent variable mimics the temperature behavior of the output parameter. Examples of the nonlinear temperature-dependent variable include a Taylor polynomial approximation of the output parameter, an exponential function, and a Bessel approximation.

In some embodiments, the adjusting includes adjusting the output to input ratio of at least one digital to analog converter (DAC) and storing the value of the ratio in a memory device.

In some examples, the adjustments are preformed at more temperatures by: adjusting the output parameter to the target level at a fourth temperature using the linear-dependent variable; adjusting the nonlinear temperature-dependent variable to zero at the fourth temperature; and adjusting the output parameter to the target level at a fifth temperature by adjusting the nonlinear variable. The fourth temperature may be lower than the first temperature and the fifth temperature may be between the fourth temperature and the first temperature.

Another example method is for adjusting the output voltage of a voltage source, which includes: adjusting the output voltage to a target voltage at a first temperature; adjusting a linear temperature-dependent variable to zero at the first temperature; adjusting a nonlinear temperature-dependent variable to zero at the first temperature; adjusting the output voltage to the target voltage at a second temperature by adjusting the linear-dependent variable; adjusting the nonlinear temperature-dependent variable to zero at high temperature; and adjusting the output voltage to the target voltage at a third temperature by adjusting the nonlinear variable.

This example may further include: adjusting the output parameter to the target level at a fourth temperature using the linear-dependent variable; adjusting the nonlinear temperature-dependent variable to zero at the fourth temperature; and adjusting the output voltage to the target voltage at a fifth temperature by adjusting the nonlinear variable. An example of the linear temperature-dependent variable is the difference between a current that is proportional to absolute temperature and a current that is complementary to absolute temperature.

In some examples, the nonlinear temperature-dependent variable mimics the temperature behavior of the output voltage and may include an exponential function.

The adjusting may include adjusting the output to input ratio of at least one digital to analog converter (DAC) and storing the value of the ratio in a memory device.

An example of the circuitry for generating an output parameter and maintaining the output parameter substantially constant over temperature variations includes: a bandgap core for generating the output parameter, the bandgap core wherein the bandgap core has an input for trimming the output parameter and an output for outputting a temperature dependent signal representative of the output parameter; circuitry for generating a nonlinear component of the output parameter as a function of temperature; and circuitry for generating a signal for the input, the signal for trimming the output parameter at least partially based the nonlinear components of the output parameter as a function of temperature. In some examples the output parameter is voltage.

DETAILED DESCRIPTION

Circuits and methods for trimming output parameters are disclosed herein. The trimming circuits and methods presented herein may be described in terms of various functional components and various processing steps. It should be appreciated that such circuits and methods may be realized by any number of hardware or structural components configured to perform the specified functions. For example, the present circuits may employ various integrated components such as voltage and current references, current mirrors, digital to analog converters, and the like that include various electrical devices whose values may be suitably configured for various intended purposes. In addition, the exemplary circuits and methods may be practiced in a plurality of applications. However, for purposes of illustration only, exemplary embodiments of the circuits and methods are described herein in connection with the trimming of a voltage reference circuit.

Temperature trimming techniques for electronic devices, such as an integrated electronic device, are limited in that they eliminate only the linear component of temperature drift. The nonlinear component of temperature drift (sometimes referred to as "curvature compensation") is typically compensated for by guessing or estimating. However, the nonlinear component of the temperature drift significantly affects operation of the electronic devices. For example, the nonlinear temperature drift may limit the accuracy of some voltage references in the electronic devices to approximately 5 ppm/° C., and more often to 8-10 ppm/° C.

Circuits and methods that compensate for temperature are disclosed herein. The temperature compensation includes trimming parameters at three or more temperatures, which enables independent adjustments of the output parameter by trimming not only linear drift, but also the nonlinear portion of drift resulting from temperature variations.

Figure 1:
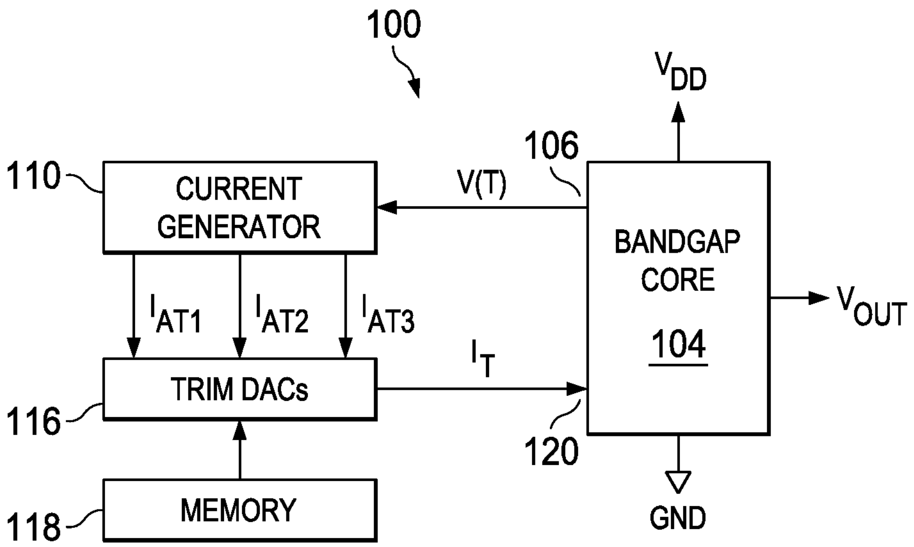
FIG. 1 is a block diagram of an example of a bandgap generation circuit

FIG. 1 is a block diagram of an example of a bandgap voltage generation circuit 100. The circuit 100 is an example of a circuit in which the circuits and methods described above are implemented. The circuit 100 generates a precise output voltage $V_{OUT}$ that is minimally dependent on temperature. The output voltage $V_{OUT}$ is sometimes referred to as the bandgap voltage. A bandgap core 104 generates the output voltage $V_{OUT}$ from a supply voltage $V_{DD}$. The bandgap core 104 has an output 106 that outputs a temperature-dependent signal that is representative of the output voltage $V_{OUT}$. In the example of FIG. 1 the temperature-dependent signal is a voltage V(T) and in other embodiments, the temperature-dependent signal is a current.

A current generator 110 generates at least one current $I_{AT}$ based on the temperature-dependent signal from the output 106 of the bandgap core 104, wherein the current $I_{AT}$ is dependent on absolute temperature. In some examples the current generator 110 is a voltage to current convertor that includes at least one current mirror as described further below. The current generator 110 or portions of the current generator 110 may be located in the bandgap core 104. The current generator 110 outputs several equal currents $I_{AT1}$, $I_{AT2}$, and $I_{AT3}$ (collectively referred to as $I_{AT}$) in response to the voltage V(T). The currents $I_{AT}$ are output to trim digital-to-analog converters (DACs) 116 that receive digital signals and process the currents $I_{AT}$ based on signals from memory 118. The trim DACs 116 generate a trim current $I_T$ that is received at an input 120 of the bandgap core 104. The current $I_T$ causes the bandgap core 104 to change the output voltage $V_{OUT}$ so that it remains constant irrespective of temperature changes.

The DACs 116 described herein serve as multiplication DACs wherein their outputs are proportional to their inputs. More specifically, the outputs are multiples of their inputs. A signal, such as a digital signal from the memory 118, determines the gain of the individual DACs. For example, a DAC may receive a signal from the memory 118 that causes the output to be one half of the input. Accordingly, the DAC reduces the input current it receives in half. In other examples, the DAC may double the input current.

Figure 2:
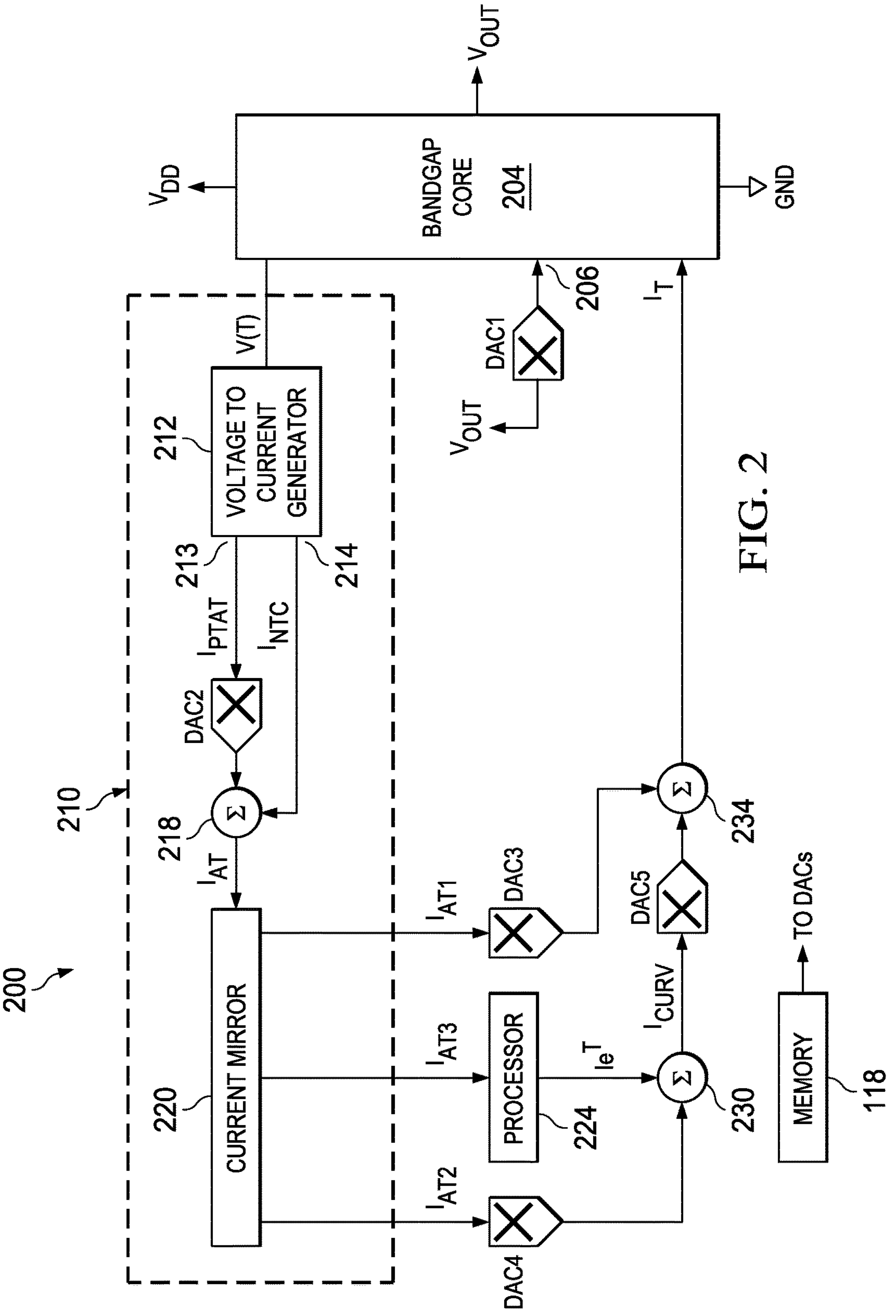
FIG. 2 is a block diagram of another example of a bandgap generation circuit.

FIG. 2 is a more detailed block diagram of a bandgap generator 200. The bandgap generator 200 includes a bandgap core 204 that generates an output voltage $V_{OUT}$. The bandgap core 204 is powered by a voltage $V_{DD}$ that also supplies power to other components in the bandgap generator 200. The bandgap core 204 has an input 206 that is coupled to a first DAC, DAC1, that trims the output voltage $V_{OUT}$ at a first temperature, such as a low temperature. In some examples, the current $I_T$ trims the output voltage $V_{OUT}$ at low temperatures and in other examples, DAC1 controls switches (not shown) inside the bandgap core 204 that set the output voltage $V_{OUT}$.

The bandgap core 204 generates the voltage V(T). The voltage V(T) is output to a current generator 210, which is similar to the current generator 110 of FIG. 1. The current generator 210 has a voltage to current generator 212 that generates two output currents, $I_{PTAT}$ and $I_{NTC}$, which are proportional to the voltage V(T) relative to ground and to $V_{OUT}$ respectively. The currents $I_{PTAT}$ and $I_{NTC}$ are outputs at a first output 213 and a second output 214, respectively. The current $I_{PTAT}$ is a current that is proportional to absolute temperature (PTAT) and the current $I_{NTC}$ is current based on a negative temperature coefficient (NTC), sometimes referred to as $I_{CTAT}$ (complimentary to absolute temperature). Being a negative temperature coefficient, the current $I_{NTC}$ decreases with increased temperature.

The current $I_{PTAT}$ is input to a second DAC, DAC2, where it is processed, such as increased or decreased depending on a signal received by the DAC2 from memory 118. The output of DAC2 and the current $I_{NTC}$ are input to a summer 218 where the current $I_{NTC}$ is subtracted from the output of DAC2 to yield a current $I_{AT}$ that is based on temperature. The current $I_{AT}$ is a linear temperature-dependent variable. The current $I_{AT}$ is input to a current mirror 220 that outputs several currents $I_{AT1}$, $I_{AT2}$, and $I_{AT3}$ that are equal to the current $I_{AT}$ to different processing circuits described below.

A first current $I_{AT1}$ is output from the current mirror 220 to a third DAC, DAC3, that trims the output voltage $V_{OUT}$ at high temperatures in response from an input from the memory 118. The function of DAC3 is described in greater detail below. A second current $I_{AT2}$ is output from the current mirror 220 to a fourth DAC, DAC4, which trims the current $I_{AT}$ at high temperature. More specifically, DAC4 trims a nonlinear temperature-dependent variable, which in the example of FIG. 2 is the current $I_{CURV}$, to zero. The operation of DAC4 is described in greater detail below.

A third current $I_{AT3}$ is output from the current mirror 220 to a processor 224 that generates a nonlinear temperature-dependent function that may be based on the magnitude and sign of the current $I_{AT3}$. The purpose of the processor 224 is to generate a nonlinear current as a function of temperature, which can be achieved by digital circuitry or analog circuitry. In some examples, the processor 224 generates a current that is proportional to an exponential of temperature and in other examples the processor 224 generates a current that is proportional to the temperature squared. In the example of FIG. 2, the output of the processor 224 is a current referred to as $I_e^T$ that is based on the exponential of the temperature because it closely mimics the nonlinear current through a transistor as a function of temperature. The current may not be $I_e^T$, but is referred as such for simplicity. Other nonlinear representations of the current based on temperature may be generated by the second processor 224. For example, the processor 224 may generate a current based on the temperature squared or cubed, or combination thereof.

The output of DAC4 and the output of the processor 224 are input to a summer 230, which outputs a signal $I_{CURV}$ wherein $I_{CURV}$ is a current representative of the nonlinear function of the current $I_{AT}$. The signal $I_{CURV}$ is input to a DAC, DAC5. The output of DAC5 and the output of DAC3 are coupled to inputs of a summer 234, wherein the output of the summer 234 is the signal $I_T$ that changes the output voltage $V_{OUT}$ based on temperature. More specifically, the signal $I_T$ changes the output voltage $V_{OUT}$ based on linear and nonlinear temperature variations of the bandgap core 204.

Figure 3:
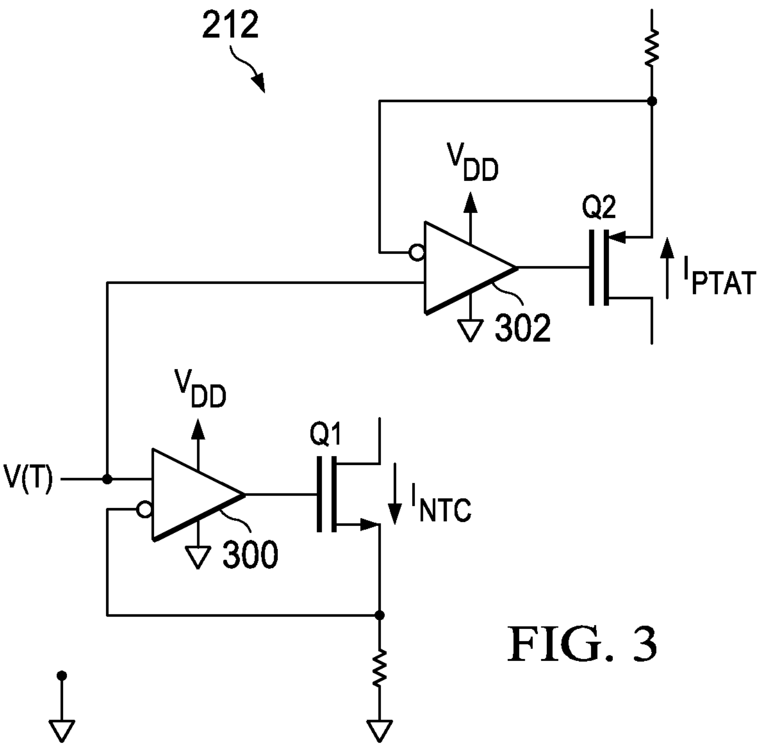
FIG. 3 is a detailed circuit of an example of the voltage to current generator of FIG. 2.

FIG. 3 is a detailed circuit of an example of the voltage to current generator 212 of FIG. 2. The generator 212 converts the voltage V(T) into two currents, $I_{PTAT}$ and $I_{NTC}$, wherein $I_{NTC}$ is sometimes referred to as $I_{CTAT}$. The voltage V(T) is input to the non-inverting inputs of a first amplifier 300 and a second amplifier 302. The output of the first amplifier 300 is coupled to the gate of a first field effect transistor (FET) Q1 and the output of the second amplifier 302 is coupled to the gate of a second FET Q2. The first FET Q1 and the second FET Q2 have opposite channels. In the example of FIG. 3, the first FET Q1 is an N-channel FET and the second FET Q2 is a P-channel FET. The source of the first FET Q1 is coupled to the inverting input of the first amplifier 300 and the source of the second FET Q2 is coupled to the inverting input of the second amplifier 302. The current flow through the first PET Q1 is the current $I_{NCT}$ and the current flow through the second PET Q2 is the current $I_{PTAT}$.

Figure 4:
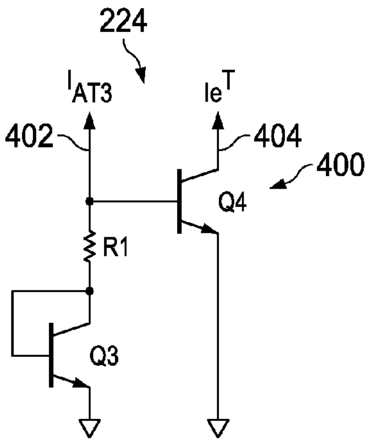
FIG. 4 is detailed circuit of an example of the processor of FIG. 2.

FIG. 4 is a detailed circuit 400 of an example of the processor 224 of FIG. 2 in the form of an analog circuit. The circuit receives the current $I_{AT3}$ at an input 402 and outputs the current $Ie^T$ or a current that is proportional to $e^T$ at an output 404. The input 402 is coupled to a transistor Q3 by way of a resistor R1. The emitter of the transistor Q3 is coupled to ground. The input 402 is also coupled to the base of a transistor Q4 wherein the emitter of the transistor Q4 is also coupled to ground. The output 404 is coupled to the collector of the transistor Q4, which is given as equation (1) as follows:

$$I = \left(1 + e^{\frac{(R1 * I_{AT3})}{V(T)}}\right) \qquad \text{Equation (1)}$$

The current that flows though the collector of the transistor Q4 is the output current referred to as $Ie^T$. The circuit 400 is an exemplary circuit that generates the current $Ie^T$. Other circuits that generate nonlinear representations of the current $I_{AT3}$ may be substituted for the circuit 400.

Figure 5:
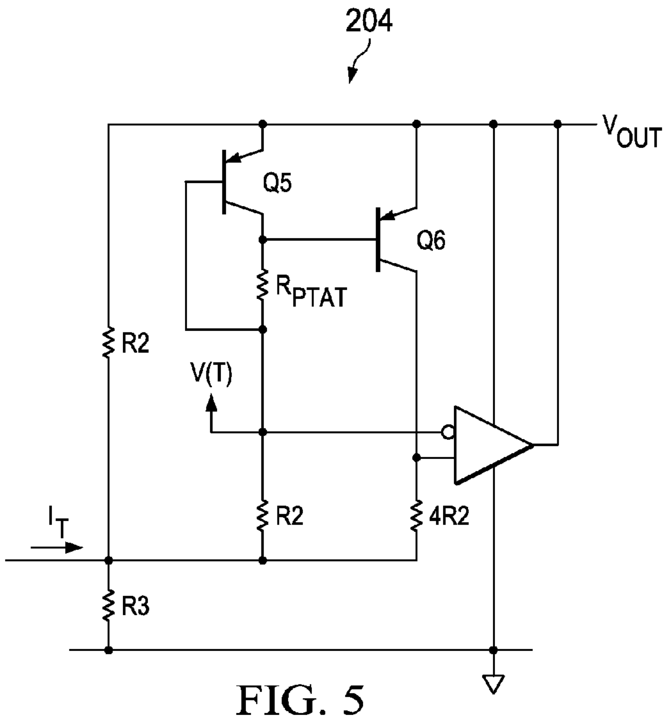
FIG. 5 is detailed circuit of an example of the bandgap core of FIG. 2.

FIG. 5 is circuit diagram of an example of the bandgap core 204. The voltage V(T) is temperature dependent and varies about 4 mV/° C. The current $I_T$ adjusts the output voltage $V_{OUT}$ by adjusting the voltage drop across the resistor R3. In some examples, DAC1 of FIG. 2 sets resistor values to adjust the value of $V_{OUT}$.

Figure 6A:
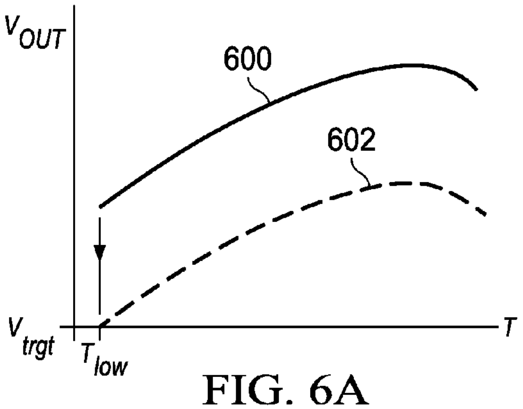
FIG. 6A is a graph showing trimming the bandgap voltage to a target voltage at low temperature.
Figure 6B:
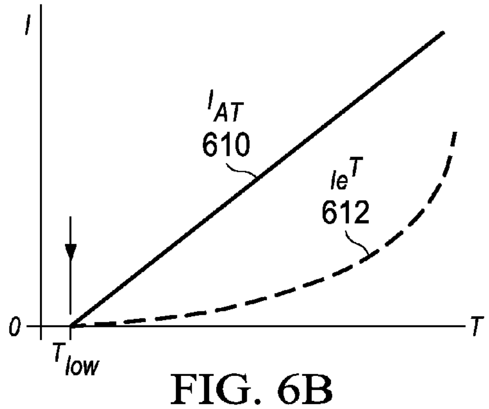
FIG. 6B is a graph showing trimming two currents to zero at low temperature.

Having described the bandgap generator 200, processes for trimming the bandgap generator 200 to achieve a specific output voltage $V_{OUT}$ over a wide temperature range will now be described. The trimming procedure involves trimming the bandgap generator 200 at high, medium, and low temperatures. In the examples described herein, the trimming commences with trimming at first temperature, which may be a low temperature. FIG. 6A is a graph showing trimming $V_{OUT}$ to a target voltage $V_{TRGT}$ at a low temperature. FIG. 6B is a graph showing the currents $I_{AT}$ and $I_e^T$ being trimmed to zero at the low temperature.

In FIG. 6A, the output voltage $V_{OUT}$ is trimmed to the target voltage $V_{TRGT}$ under low temperature conditions. In some examples, the low temperatures are between negative 20° C. and 20° C. The output voltage curve shifts from the curve 600 to the curve 602 as the output voltage $V_{OUT}$ is trimmed or adjusted to the target voltage $V_{TRGT}$ at the low voltage $T_{LOW}$. Trimming the output voltage $V_{OUT}$ is achieved by adjusting DAC1, which outputs a signal, such as a current, to the bandgap core 204 and sets the output voltage $V_{OUT}$ to the target voltage $V_{TRGT}$. In other examples DAC1 or an equivalent device is located in the bandgap core 204 and sets the output voltage $V_{OUT}$ by connecting and disconnecting resistors (not shown in FIG. 2) as known in the art. The DAC setting required to achieve the settings described herein are stored in memory 118 so as to program the DACs at different operating temperatures.

FIG. 6B shows a linear temperature-dependent variable being set to zero at low temperature. In the examples described herein, the linear temperature-dependent variable is the current $I_{AT}$ shown by the line 610 and is the current $I_{PTAT}-I_{NTC}$. Accordingly, setting $I_{AT}$ to zero is achieved by trimming DAC2 so that the output of DAC2 is equal to $I_{NTC}$. FIG. 6B also shows the nonlinear temperature-dependent variable being set to zero at low temperature as shown by the curve 612. This nonlinear variable mimics nonlinear temperature behavior of the parameter of interest, which in the embodiments described herein is the bandgap or output voltage $V_{OUT}$. A curve representing the nonlinear variable can be created, for example, by Taylor polynomial approximation, exponential functions such as a Bessel approximation, or trigonometric rows. Taylor polynomial approximations and Bessel approximations may be readily created in analog circuits. Other types of approximations may be applied by the use of circuitry, such as digital circuitry. The current mirror 220 described herein outputs the signal $I_{AT3}$ that is a mirror of $I_{AT}$, so when $I_{AT}$ is zero, the nonlinear current $Ie^T$ is also equal to zero.

Figure 7A:
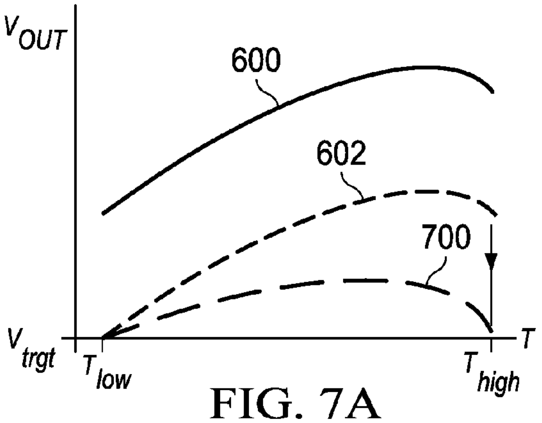
FIG. 7A is a graph showing trimming the bandgap voltage to a target voltage at high temperature.

The next trimming occurs at a second temperature, such as a high temperature. Examples of high temperatures are temperatures between 90° C. and 125° C. FIG. 7A is a graph showing the trimming of the output voltage $V_{OUT}$ to the target voltage $V_{TRGT}$ at a high temperature $T_{HIGH}$. Because the temperature of the bandgap generator 200 has changed, the output voltage $V_{OUT}$ has also changed. In the example of FIG. 7A the higher temperature has caused the output voltage $V_{OUT}$ to rise. The output voltage $V_{OUT}$ is trimmed at the high temperature by DAC3 as shown by the curve 700 of FIG. 7A. In the example of FIG. 2, the output voltage $V_{OUT}$ is trimmed based on multiples of $I_{AT}$. More specifically, DAC3 and the other DACs are multiplication-type DACs, so they output current that is multiples of the input current $I_{AT}$, which is input to the bandgap core 204 to set the output voltage $V_{OUT}$. Accordingly the output voltage $V_{OUT}$ will be at the target voltage $V_{TRGT}$ at low temperatures and at high temperatures.

Figure 7B:
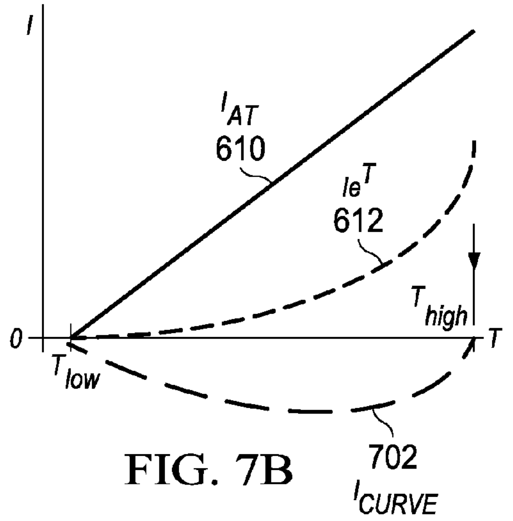
FIG. 7B is a graph showing trimming a current to zero at high temperature.

The nonlinear component is set to zero at high temperature as shown by the curve 702 of FIG. 7B. The current $I_{CURV}$ is the difference between $I_{AT2}$ and $Ie^{T}$. By adjusting DAC4, the two currents are set equal and they are subtracted from each other by the summer 230. In some implementations DAC4 sets the resistance value of R1 of FIG. 4 to achieve the above-described result.

Figure 8:
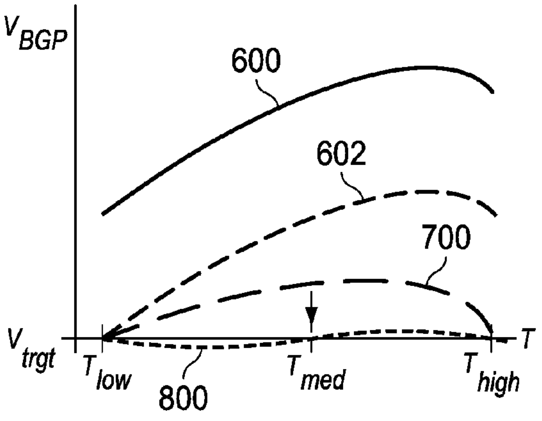
FIG. 8 is a graph showing trimming the output voltage to the target voltage at a medium temperature.

FIG. 8 is a graph showing the output voltage $V_{OUT}$ being trimmed to the target voltage $T_{TRGT}$ at a medium temperature $T_{MED}$ as shown by the curve 800. Trimming the output voltage $V_{OUT}$ at the medium temperature $T_{MED}$ is accomplished by use of DAC5. The current $I_{AT3}$ is converted to a nonlinear function $Ie^{T}$ by the processor 224. The nonlinear $Ie^{T}$ current is an exponential function of temperature and flows to DAC5. The current is trimmed to zero at the high temperature $T_{HIGH}$ and is used to trim the current $I_T$ to trim the output voltage $V_{OUT}$ to the target voltage $V_{TRGT}$ at the medium temperature $T_{MED}$. More specifically, the current $I_{CURV}$ of FIG. 7B is zero at low temperature and high temperature. Therefore, the trimming of DAC5 does not affect the $V_{OUT}$ at low or high temperatures because $I_{CURV}$ has been set to zero at these points.

As shown in FIG. 8, the output voltage $V_{OUT}$ remains substantially constant over a wide temperature range. Some conventional devices that do not trim the nonlinear portions of the output voltage $V_{OUT}$ only have output voltages as shown by the curve 700 of FIG. 8, which are not accurate between the low voltage $V_{LOW}$ and the high voltage $V_{HIGH}$.

Figure 9:
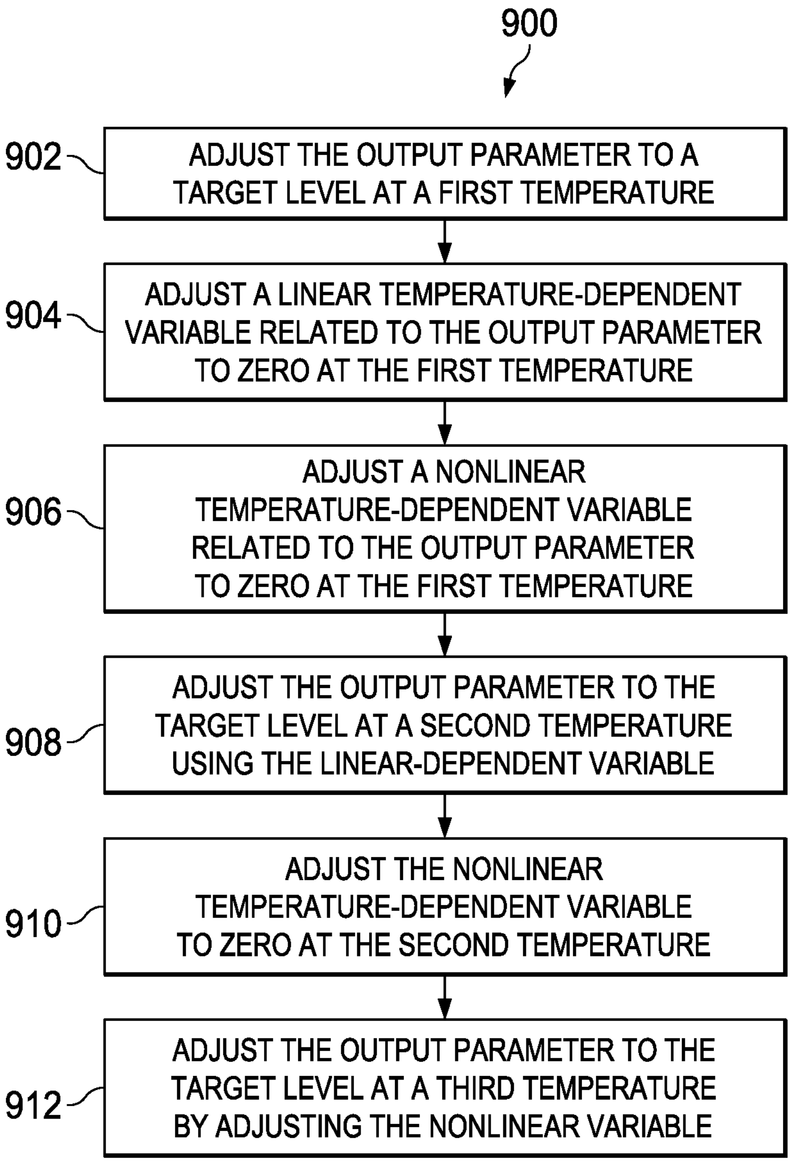
FIG. 9 is a flowchart describing trimming an output parameter.

The above described operation of trimming an output parameter is shown by the flowchart 900 of FIG. 9. The flowchart 900 commences with adjusting the output parameter to a target level at a first temperature at step 902. At step 904, a linear temperature-dependent variable related to the output parameter is adjusted to zero at the first temperature. The flowchart 900 continues with adjusting a nonlinear temperature-dependent variable related to the output parameter to zero at the first temperature at step 906. At step 908 the output parameter is adjusted to the target level at a second temperature using the linear-dependent variable. The nonlinear temperature-dependent variable is adjusted to zero at the second temperature in step 910. At step 912, the output parameter is adjusted to the target level at a third temperature by adjusting the nonlinear variable.

The methods have been described above as being performed at three temperatures. In other examples, two more trimming are performed at temperatures below $V_{LOW}$. Different trim coefficients are used depending whether the device temperature is above or below TLOW. For example, a comparator can determine the sign of $I_{AT}$ to determine whether the temperature is above or below $T_{LOW}$. The processes of FIGS. 7A and 7B are repeated for a forth temperature, which is sometimes referred to as a very low temperature. The process described in FIG. 8 is repeated for a fifth temperature which is between the very low temperature and $T_{LOW}$.

While some examples of voltage generators and trimming methods have been described in detail herein, it is to be understood that the inventive concepts may be otherwise variously embodied and employed and that the appended claims are intended to be construed to include such variations except insofar as limited by the prior art.

What is claimed is:

1. A method for adjusting a temperature dependent output parameter of a device, the method comprising:

adjusting, by a trimming circuit, the output parameter to a target level at a first temperature;

adjusting, by the trimming circuit, a first variable related to the output parameter to zero at the first temperature, the first variable comprising a temperature dependency varying linearly with temperature;

adjusting, by the trimming circuit, a second variable related to the output parameter to zero at the first temperature, the second variable comprising a temperature dependency varying non-linearly with temperature;

adjusting, by the trimming circuit, the output parameter to the target level at a second temperature using the first variable;

adjusting, by the trimming circuit, the second variable to zero at the second temperature; and adjusting, by the trimming circuit, the output parameter to the target level at a third temperature by adjusting the second variable, wherein the trimming circuit comprises at least one digital to analog converter (DAC) and wherein the adjusting the output parameter comprises adjusting a gain of the at least one DAC.

2. The method of claim 1, wherein the output parameter is an output voltage.

3. The method of claim 1, wherein the first variable is the difference between a current proportional to absolute temperature and a current complementary to absolute temperature.

4. The method of claim 1, wherein the second variable has a temperature dependency similar to that of the output parameter.

5. The method of claim 1, wherein the second variable is a Taylor polynomial approximation of the output parameter.

6. The method of claim 1, wherein the second variable is an exponential function of the output parameter.

7. The method of claim 1, wherein the second variable is a Bessel approximation of the output parameter.

8. The method of claim 1, wherein a value of the gain of the at least one DAC is stored in a memory device.

9. The method of claim 1, wherein the third temperature is between the first temperature and the second temperature.

10. The method of claim 1, further comprising:

adjusting, by the trimming circuit, the output parameter to the target level at a fourth temperature using the first variable;

adjusting, by the trimming circuit, the second variable to zero at the fourth temperature; and adjusting, by the trimming circuit, the output parameter to the target level at a fifth temperature by adjusting the second variable.

11. The method of claim 10, wherein the fourth temperature is lower than the first temperature and wherein the fifth temperature is between the fourth temperature and the first temperature.

12. The method of claim 1, wherein the trimming circuit comprises a plurality of digital-to-analog converters.

13. A method for adjusting an output voltage of a voltage source, the method comprising:

adjusting, by a trimming circuit, the output voltage to a target voltage at a first temperature;

adjusting, by the trimming circuit, a first variable related to the output voltage to zero at the first temperature, the first variable comprising a temperature dependency varying linearly with temperature;

adjusting, by the trimming circuit, a second variable related to the output voltage to zero at the first temperature, the second variable comprising a temperature dependency varying non-linearly with temperature;

adjusting, by the trimming circuit, the output voltage to the target voltage at a second temperature by adjusting the first variable;

adjusting, by the trimming circuit, the second variable to zero at the second temperature; and adjusting, by the trimming circuit, the output voltage to the target voltage at a third temperature by adjusting the second variable, wherein the trimming circuit comprises at least one digital to analog converter (DAC) and wherein the adjusting the output voltage comprises adjusting a gain of the at least one DAC.

14. The method of claim 13, further comprising:

adjusting, by the trimming circuit, the output voltage to the target level at a fourth temperature using the first variable;

adjusting, by the trimming circuit, the second variable to zero at the fourth temperature; and adjusting, by the trimming circuit, the output voltage to the target voltage at a fifth temperature by adjusting the second variable.

15. The method of claim 13, wherein the first variable is the difference between a current that is proportional to absolute temperature and a current that is complementary to absolute temperature.

16. The method of claim 13, wherein the second variable has a temperature dependency similar to that of the output voltage.

17. The method of claim 13, wherein the nonlinear temperature-dependent variable is an exponential function of the output voltage.

18. The method of claim 13, wherein a value of the gain of the at least one DAC is stored in a memory device.

19. A circuit for generating and adjusting a temperature dependent output parameter, the circuitry comprising:

a bandgap core configured to generate the output parameter, the bandgap core having an input configured to receive a signal for trimming the output parameter and an output configured to output a temperature dependent signal representative of the output parameter; and a trimming circuit comprising at least one digital to analog converter (DAC), the trimming circuit configured to generate the signal to the input of the bandgap core by:

adjusting the output parameter to a target level at a first temperature, adjusting a first variable related to the output parameter to zero at the first temperature, the first variable comprising a temperature dependency varying linearly with temperature, adjusting a second variable related to the output parameter to zero at the first temperature, the second variable comprising a temperature dependency varying non-linearly with temperature, adjusting the output parameter to the target level at a second temperature using the first variable, adjusting the second variable to zero at the second temperature, and adjusting the output parameter to the target level at a third temperature by adjusting the second variable, wherein the adjusting the output parameter comprises adjusting a gain of the at least one DAC.

20. The circuitry of claim 19, wherein the output parameter is an output voltage.

* * * * *